(12) United States Patent
Wolfe et al.

(10) Patent No.: US 8,987,688 B2
(45) Date of Patent: *Mar. 24, 2015

(54) DEVICE AND METHOD FOR MANUFACTURING A PARTICULATE FILTER WITH REGULARLY SPACED MICROPORES

(75) Inventors: John C. Wolfe, Houston, TX (US); Paul Ruchhoeft, Missouri City, TX (US)

(73) Assignee: The University of Houston, Houston, TX (US)

(*) Notice: Subject to any disclaimer, the term of this patent is extended or adjusted under 35 U.S.C. 154(b) by 179 days.

This patent is subject to a terminal disclaimer.

(21) Appl. No.: 12/530,978

(22) PCT Filed: Mar. 13, 2008

(86) PCT No.: PCT/US2008/056848
§ 371 (c)(1),
(2), (4) Date: Feb. 5, 2010

(87) PCT Pub. No.: WO2008/112888
PCT Pub. Date: Sep. 18, 2008

(65) Prior Publication Data
US 2010/0147693 A1    Jun. 17, 2010

Related U.S. Application Data

(63) Continuation of application No. 11/856,615, filed on Sep. 17, 2007, now Pat. No. 7,960,708.

(60) Provisional application No. 60/894,593, filed on Mar. 13, 2007.

(51) Int. Cl.
*A61N 5/00* (2006.01)
*G03B 27/42* (2006.01)
(Continued)

(52) U.S. Cl.
CPC ............ *G03B 27/42* (2013.01); *B01D 67/0034* (2013.01); *B01D 71/48* (2013.10); *G03F 7/0015* (2013.01); *B01D 2323/42* (2013.01); *B01D 2325/028* (2013.01)
USPC ....................................................... 250/492.1

(58) Field of Classification Search
USPC ................. 250/492.1, 492.21, 492.22, 492.3; 264/413, 154, 41
See application file for complete search history.

(56) References Cited

U.S. PATENT DOCUMENTS 3,303,085 A    2/1967   Price et al.
3,438,504 A *  4/1969   Furman ......................... 210/483
(Continued)

OTHER PUBLICATIONS

Emissivity Coefficients of Some Common Materials, www.EngineeringToolBox.com, accessed from <http://www.engineeringtoolbox.com/emissivity-coefficients-d_447.html>.*

(Continued)

*Primary Examiner* — Nicole Ippolito
*Assistant Examiner* — Jason McCormack
(74) *Attorney, Agent, or Firm* — Winstead PC

(57) ABSTRACT

Various embodiments disclose devices and methods for fabricating microporous particulate filters with regularly spaced pores wherein sheet membrane substrates are exposed to energetic particle radiation through a mask and the damaged regions removed in a suitable developer. The required depth of field is achieved by using energetic particles to minimize diffraction and an energetic particle source with suitably small diameter.

24 Claims, 16 Drawing Sheets

(51) Int. Cl.
*B01D 67/00* (2006.01)
*B01D 71/48* (2006.01)
*G03F 7/00* (2006.01)

(56) References Cited

U.S. PATENT DOCUMENTS

| | | | |
|---|---|---|---|
| 3,770,532 | A | 11/1973 | Bean et al. |
| 3,802,972 | A | 4/1974 | Fleischer et al. |
| 4,321,299 | A * | 3/1982 | Frosch et al. ............... 442/379 |
| 4,832,997 | A | 5/1989 | Balanzat et al. |
| 4,900,939 | A * | 2/1990 | Aoyama ...................... 250/548 |
| 4,956,219 | A * | 9/1990 | Legras et al. ................ 343/771 |
| 5,543,046 | A | 8/1996 | Van Rijn |
| 5,753,014 | A | 5/1998 | Van Rijn |
| 5,786,396 | A | 7/1998 | Takita et al. |
| 6,159,558 | A * | 12/2000 | Wolfe et al. .................. 427/523 |
| 6,762,396 | B2 | 7/2004 | Abbott et al. |
| 6,806,520 | B2 * | 10/2004 | Theiss et al. ................. 257/288 |
| 7,109,500 | B2 * | 9/2006 | Omori et al. ............. 250/492.22 |
| 7,118,657 | B2 * | 10/2006 | Golovchenko et al. .... 204/192.3 |
| 7,365,023 | B2 * | 4/2008 | Takei et al. ................... 438/758 |
| 7,442,303 | B2 * | 10/2008 | Jacobson ...................... 210/510.1 |
| 7,483,123 | B2 * | 1/2009 | Hirayanagi ..................... 355/72 |
| 2003/0020024 | A1 * | 1/2003 | Ferain et al. ................ 250/492.1 |
| 2004/0178362 | A1 * | 9/2004 | Gilissen et al. ............. 250/492.1 |
| 2005/0116176 | A1 * | 6/2005 | Aguirre et al. ............. 250/492.1 |
| 2005/0128448 | A1 | 6/2005 | Box et al. |
| 2005/0241933 | A1 * | 11/2005 | Branton et al. .......... 204/192.34 |
| 2005/0263452 | A1 * | 12/2005 | Jacobson ...................... 210/484 |
| 2006/0124865 | A1 | 6/2006 | Wolfe et al. |
| 2006/0132735 | A1 * | 6/2006 | Lof et al. ........................ 355/53 |
| 2006/0132736 | A1 * | 6/2006 | Nagasaka et al. ............... 355/53 |
| 2006/0183055 | A1 * | 8/2006 | O'Neill et al. ................ 430/316 |
| 2007/0116610 | A1 | 5/2007 | Cuppoletti |
| 2008/0264553 | A1 * | 10/2008 | Wu et al. ........................ 156/220 |

OTHER PUBLICATIONS

Office Action issued Mar. 24, 2010, U.S. Patent & Trademark Office, U.S. Appl. No. 11/856,615.

R.G. Musket, "Extending ion-track lithography to the low-energy ion regime," Journ. Appl. Phys. 99, 114314 (2006).

Emissivity of Materials, http://www.electro-optical.com/bb_rad/emissivity/matlemisivty.htm#Conductive Paints, Accessed Jan. 25, 2010.

Nobuhiro Tokoro, et al., "Introduction of the Varian VIISta 3000 Single Wafer High-Energy Ion Implanter," IEEE Conf. on Ion Implantation Technology, 368 (2000).

A. Roy, et al., "Image noise in helium lithography," In press Journ. Vac. Sci. Technol., Aug. 11, 2011.

J.R. Wasson, et al., "Ion Absorbing Stencil Mask Coatings for Ion Beam Lithography" Journ. Vac. Sci. Technol. B 15, 2214-2217 (1997).

T. Yamauci, et al., "Structural modification along heavy ion tracks in poly(allyl diglycol carbonate) films," Japanese Journ. Appl. Phys. 47, 3606 (2008).

J. N. Randall and J. C. Wolfe, "Preparation of X-ray lithography masks using a tungsten reactive ion etching process," Appl. Phys. Letts. 41, 247-248 (1982).

S.V. Pendharkar and J. C. Wolfe, "Tungsten trench etching in a magnetically enhanced triode reactor," Journal of Vacuum Science and Technology 12, 601-604 (1994).

L. R. Harriott, "SCALPEL: projection electron beam lithography," Proceedings of the Particle Accelerator Conference, 595, 1999.

Han, et al., "Fabrication and Characterization of Polymeric Microfiltration Membranes using Aperture Array Lithography," Journal of Membrane Science, vol. 249 Issues 1-2, pp. 193-206 (2005).

PCT Search Report issued for Application No. PCT/US 08/56848, dated Jul. 28, 2008.

Parekh, V. et al., "Estimation of scattered particle exposure in ion beam aperture array lithography," J. Vac. Sci. Technol. B 24(6), Nov./Dec. 2006, pp. 2916-2919.

Friedland, Stephen S., "On the Energy Distribution of The Fission Fragments of U235 Produced by 2.5-Mev and 14-Mev Neutrons," Los Alamos Scientific Laboratory, University of California, Mar. 10, 1950.

* cited by examiner

FIG. 10a  FIG. 10b

DEVICE AND METHOD FOR MANUFACTURING A PARTICULATE FILTER WITH REGULARLY SPACED MICROPORES

CROSS REFERENCE TO RELATED APPLICATIONS

This application claims priority to, and is a continuation-in-part of, PCT Application No. PCT/US2008/056848, filed on Mar. 13, 2008, which claims priority to U.S. Provisional Application No. 60/894,593, filed on Mar. 13, 2007, and U.S. patent application Ser. No. 11/856,615, filed on Sep. 17, 2007.

STATEMENT REGARDING FEDERALLY SPONSORED RESEARCH

The present disclosure was funded in part with government support under NSF Award No. ECS-0404308, NSF Award No. IOB-0517262, and U.S. Air Force Office of Scientific Research Award No. FA9550-06-1-0401.

This invention was made with government support under Grant No. ECS-0404308, awarded by the National Science Foundation; Grant No. IOB-0517262, also awarded by the National Science Foundation; and U.S. Air Force Office of Scientific Research Grant No. FA 9550-06-0401, awarded by the U.S. Department of Defense. The government has certain rights in the invention.

BACKGROUND

1. Field of the Invention

The present invention relates to a method for manufacturing a particulate filter comprising a membrane with a high density array of regularly spaced micropores and a macroporous support.

2. Description of the Background Art

A lithographic apparatus or device is a machine that applies a desired pattern onto a substrate, usually onto a target portion of the substrate, such as a membrane substrate. A lithographic device can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The formation of membrane filters with small straight-through holes of extremely small diameter and methods of making such porous bodies and/or microporous membranes are well known. Microporous membranes can be produced with particles which produce chains of defects in the glass, crystal or polymer membrane corresponding to the path of the particles. These defects make the areas around them very sensitive to various chemical agents. An exposure of relatively short duration to these agents makes it possible to produce pores at various locations. A longer exposure makes it possible to expand the number of pores. Accordingly, in various prior art processes the duration of chemical attack or etching facilitates control of the diameter of the pores produced, i.e. the filtration characteristic of the filter.

Various methods including combinations of irradiation damage along substantially straight paths and chemical removal of the damaged material to provide pores or holes; bombarding a solid with heavy energetic particles to produce tracks of radiation damaged material which are removed by etching; forming ionization tracks in a membrane and removing by exposure to a suitable etchant solution; two-step etching processes that permits widening of the ion tracks to make a range of larger pore sizes; and/or the like. Typically the pores have been constructed to have a conical shape so as to assist back flushing.

Often, however, filters constructed as disclosed have suffered from a high or higher specific flow resistance per unit area compared to other filter technologies. As a result, larger areas and/or higher differential pressures are required to achieve a particular filtrate flow than for low resistance filters. One solution for this issue has been the use of a macroporous support for a microporous filter membrane to enable thinner filter membranes to withstand the same filtration pressure. It has been observed that flow resistance is reduced in proportion to the reduction in thickness. Likewise, Keping Han, Wendong Xu, Ariel Ruiz, Paul Ruchhoeft, and Shankar Chellam, "Fabrication and Characterization of Polymeric Microfiltration Membranes using Aperture Array Lithography," *Journal of Membrane Science*, Vol. 249 Issues 1-2, pages 193-206 (2005) discloses the use of a regular array of etched pores to form a filter membrane. This enables higher pore densities than are possible by the random array formed by ionization tracks because it eliminates the possibility of overlapping pores which compromise the selectivity of the filter. The flow resistance is reduced in inverse proportion to the increase in pore density. Primarily, the filters with a support have been formed on a flat solid substrate, thereby having at least the additional material cost of the flat substrates, multiple fabrication process steps, with the attendant inherent variation, and the fabrication of a large area of membranes by splicing or tiling together a multitude of small discrete membranes.

Accordingly, it would be beneficial to the art field of producing filter membranes to accomplish at least one of minimizing process variation through producing the filter membranes in a continuous process; producing filter membranes with increased and/or enhanced pore density; producing filter membranes without the necessity of a solid support; and/or the like.

SUMMARY

In various embodiments, ion-track lithography systems for irradiating a polymeric membrane are described. The ion-track lithography systems include a particle source of energetic particles, a mask and means for transporting the polymeric membrane relative to the particle source. The polymeric membrane is not supported on a solid substrate. The energetic particles have an energy that is sufficient to completely penetrate the polymeric membrane but less than the Bragg energy of the energetic particles. The mask includes a stencil pattern and is positioned between the particle source and the polymeric membrane. At least a portion of the energetic particles travel through the stencil pattern and irradiate the polymeric membrane.

Other various embodiments of ion-track lithography systems for irradiating a polymeric membrane are also described herein. The ion-track lithography systems include a particle source of energetic particles, a mask and a system for transporting the polymeric membrane. The polymeric membrane is not supported on a solid substrate. The energetic particles have an energy that is sufficient to form continuous tracks in the polymeric membrane but less than the Bragg energy of the energetic particles. The mask includes a stencil pattern and is positioned between the particle source and the polymeric membrane. At least a portion of the energetic particles travel through the stencil pattern and irradiate the polymeric membrane. The system for transporting the polymeric membrane includes at least one supply reel and at least one take-up reel.

In still other various embodiments, methods for patterning a polymeric membrane are disclosed herein. The methods include a) providing a polymeric membrane not supported on a solid substrate, b) providing a mask including a plurality of holes, c) irradiating the polymeric membrane with a source of $Ne^+$ ions, and d) transporting the polymeric membrane. The $Ne^+$ ions have an energy that is sufficient to completely penetrate the polymeric membrane but less than the Bragg energy of the $Ne^+$ ions. At least a portion of the $Ne^+$ ions travel through the plurality of holes prior to irradiating the polymeric membrane.

In still other various embodiments, filter membranes are described herein. The filter membranes are prepared by a process including: a) providing a polymeric membrane not supported on a solid substrate, b) providing a mask including a plurality of holes, c) irradiating the polymeric membrane with a source of $Ne^+$ ions, d) transporting the polymeric membrane, and e) etching the polymeric membrane with an etchant. The $Ne^+$ ions have an energy that is sufficient to completely penetrate the polymeric membrane but less than the Bragg energy of the $Ne^+$ ions. At least a portion of the $Ne^+$ ions travel through the plurality of holes prior to irradiating the polymeric membrane. Etching includes forming a plurality of pores in the polymeric membrane.

The foregoing has outlined rather broadly various features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
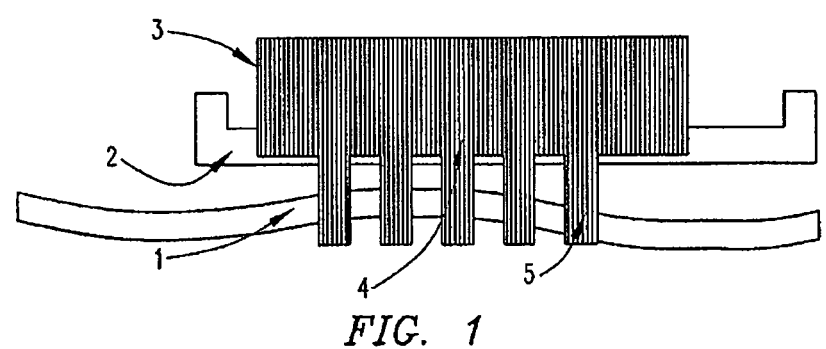
FIG. 1 is an illustration of an embodiment of the present invention wherein a beam of energetic particles impinges on a substantially planar mask perforated by openings damaging a non-planar membrane substrate in a highly uniform array of regularly spaced regions.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings and/or examples making apparent to those skilled in the art how the several forms of the invention may be embodied in practice.

The following definitions and explanations are meant and intended to be controlling in any future construction unless clearly and unambiguously modified in the following Examples or when application of the meaning renders any construction meaningless or essentially meaningless. In cases where the construction of the term would render it meaningless or essentially meaningless, the definition should be taken from Webster's Dictionary, $3^{rd}$ Edition.

As used herein, all percentages are percentages by weight, unless stated otherwise.

As used herein, the term "radiation" means and refers to energy radiated or transmitted as rays, waves, in the form of particles.

In general, various embodiments of the present invention provides processes and systems for manufacturing large area or enhanced area filter membranes from polymeric sheet stock. Further, various embodiments of the present invention relate to the as produced filter membranes. Embodiments of processes, systems and filters of the present invention generally provide for at least one of minimized process variation and cost through producing the filter membranes in a continuous process; producing filter membranes with increased and/or enhanced pore density without pore overlap; producing filter membranes without the necessity of a solid support; producing large area filters without the necessity of splicing or tiling small discrete filters together, and/or the like.

In various embodiments, energetic particles are used to damage a polymeric membrane substrate and a suitable etchant, such as, but not limited to a hot solution of KOH, is used to remove the damaged substrate material. A substantially uniform array of holes is formed by energetic particle exposure through a mask. In an embodiment, the array of holes is uniform throughout the substrate material.

Membrane substrates of the present invention can be produced supported or unsupported. In an embodiment, a membrane substrate is processed as a free-standing polymeric sheet. In an alternate embodiment, a macroporous backing is present on at least a portion of the substrate to enhance strength characteristics.

In various embodiments, a membrane substrate is deposited by extrusion, casting, spin coating, vapor deposition, epitaxy, chemical vapor deposition, sputtering, and/or any other process common in the art. Typical thicknesses of a membrane substrate of the present invention in an embodiment are about 20 µm to about 500 nm. In an alternate embodiment, a thicknesses of a membrane substrate of the present invention is about 100 nm to about 5 µm. In an alternate embodiment, a thicknesses of a membrane substrate of the present invention is about 10 nm to about 10 µm. In an alternate embodiment, a thicknesses of a membrane substrate of the present invention is about 5 nm to about 15 µm. However, in general, various embodiments of the membranes of the present invention can be formed of any thickness.

Deposition techniques are well understood in the art field, especially the semiconductor art field, and the production of substantially flat membrane substrate, void from any substantial protrusions or other irregularities, is readily obtainable. However, in applications where a substantially flat membrane substrate is not required, extrusion, casting, spraying, sol-gel plating, and/or the like is capable of use for forming the membrane substrate. In general, any technique known in the art can be used in various embodiments of the present invention.

A membrane filter of various embodiments of the present invention is characterized in that said membrane comprises a substantially flat layer of substantially uniform thickness and in that the surface of said layer is substantially void of any protrusions or any other irregularities. Appropriate thickness and uniformity of a membrane are characteristics capable of optimization to resist high relative fluxes from a variety of processes. To enhance the flow rate the filter should present a resistance which is as low as possible and therefore, in a preferred embodiment of the invention, comprises a membrane whose thickness is smaller than the average pore size and whose pore density is larger than 1 million per square centimeter.

In general, the characteristic of selectivity of a filter membrane is determined by its largest pore(s). At the same time, flow resistance is reduced by having a maximum pore size assuming the same pore density. Consequently it is desirable to have a pore size distribution which is as uniform as possible. In order to offer a large selectivity a specific embodiment of the filter according to the invention is characterized in that the pores consist of perforations with relatively smooth edges and in that the membrane features a relatively sharp, well defined pore size distribution within a standard deviation of less than about 5%, as mentioned previously. In an alternate embodiment the standard deviation is less than about 3%. In an alternate embodiment the standard deviation is less than about 1%.

Other embodiments are compared such that size of a hole differs by no greater than 5% from the size of any other hole formed in the substrate. In an alternate embodiment, the size difference is less than about 3%. In an alternate embodiment, the size difference is less than about 1%. In an alternate embodiment, the size difference is less than about 0.5%. In general, a membrane is capable of better performance characteristics with uniformity of hole size. However, various embodiments are capable of producing a non-uniform hole size as needed for a particular process and/or membrane.

Depending on the application for the membrane filter, the perforations in the membrane may be constructed so as to be cylindrical, tapering, and/or the like. Tapering embodiments are particularly useful in 'back flush' applications, clogged perforations are easily reopened by means of a counter pressure pulse.

Suitable materials for the membrane filter of various embodiments of the present invention are preferentially of a polymeric material, such as, but not limited to polyurethane, polytetrafluoroethylene (TEFLON), polyamide, polyamide, polyvinyl, polymethylmethacrylate, polypropylene, polyolefin, polycarbonate, polyester, cellulose, polyformaldehyde and polysulfone. Further embodiments are capable of comprising a biocompatible coating, such as a heparin coating and/or the like.

The support may be macroporous with a tortuous pore structure, a sintered ceramic material, a sintered metal powder or a polymeric tortuous membrane, as well as an initially dense material in which in a later stage openings are made, for example in a semiconductor wafer, a metal support or an inorganic disc. The total strength of a membrane substrate of the present invention may be increased by a number of relatively thin supporting bridges in the support underneath. In various embodiments utilizing a support, between the membrane layer and the support layer, an intermediate layer may be deposited for bonding enhancement and stress reduction. Bonding enhancement layers might be silicon dioxide and titanium dioxide depending upon the nature of the membrane and support materials. In various embodiments, the intermediate layer may moreover act as an etch stop layer.

Generally, in forming holes within the membrane substrate, any source of energetic particles, such as, ions, photons, electrons, neutral energetic atoms, and/or molecules can be used, such as, but not limited to photons, $He^+$, $H^+$, suitable equivalents, and/or the like. For example, according to some embodiments, neutrals and/or ions of an element selected from the group consisting of He, H, Ne, Xe, C, and B can be used. A substantially parallel beam of energetic particles is directed so as to impinge on a substantially planar mask perforated by stencil openings. In an embodiment, the stencil contains a series of uniform evenly dispersed holes through the mask. In an alternate embodiment, the stencil openings have a particular shape or design. Portions of the energetic particles passing through the holes or stencil openings in the mask damage a membrane substrate positioned about the mask. In various embodiments, the membrane substrate is essentially planar. In an alternate embodiment, the membrane substrate is non-planar.

After exposing the membrane substrate to the beam of energetic particles, the substrate may be washed in a suitable solvent to remove the damaged portions of the membrane substrate and thereby revealing the holes. Deformation of the membrane substrate during these steps is acceptable, under constraints of the present invention.

In an alternate embodiment of the method of the invention a deposited masking layer, particularly of a material sensitive to energetic particle exposure, is employed as the auxiliary layer which is brought in the desired pattern by means of an energetic particle lithography technique. The masking layer will be in contact with the membrane layer and therefore enables the transfer of its pattern to the membrane layer with a very high degree of precision. In yet an alternate embodiment an intermediate masking layer may be employed.

In various embodiments, a membrane filter of the present invention is bio-compatible. In an embodiment, a characteristic of a biocompatible membrane is that its surface is smooth, with a surface roughness less than the pore size will, thereby inhibiting sticking of particles or cells on the membrane and in the perforations. Accordingly, various embodiments of a biocompatible membrane of the present invention comprises a filter capable of use for cell-cell separation techniques and other medical and bio-medical purposes.

In an embodiment of the filter according to the invention, the support and the membrane are constituted from equivalent materials with the same or similar components, for example polycarbonate. A filter of this kind is applicable in a wide temperature range, with a good cohesion between the support and the membrane.

Alternatively a membrane of the kind used in the filter according to various embodiments of the invention may itself very well act as a support for an ultrafiltration layer. Very thin ultrafiltration layers, typically with a thickness less than 200 nm, may be deposited in or over the perforations of the membrane to constitute an ultrafiltration filter. However, the thickness of the ultrafiltration layer can varied as is suitable for the particular process.

Figure 5:
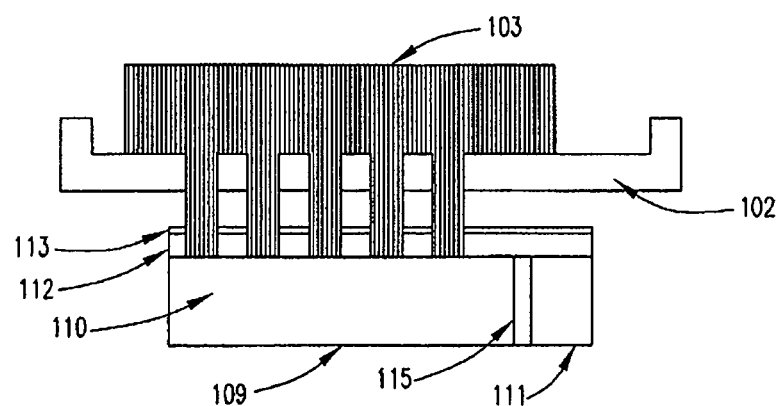
FIG. 5 is an illustration of an embodiment of electrostatic clamping for inhibiting substrate motion during ion exposure.

In various embodiments, a film processed under an embodiment of the present invention is held essentially stationary while energetic particle exposure is performed. In an embodiment, an electrostatic clamp as shown in FIG. 5 is used to clamp a thin metal film deposited onto the membrane substrate, thereby holding the membrane substrate essentially stationary with respect to the clamp.

In addition, for embodiments utilizing deposition on the membrane substrate, depending on the desired application, exemplary embodiments of the present process may utilize simultaneous or sequential deposition of multiple metals of controlled composition. Other exemplary embodiments may utilize small metal catalyst particles, such as nickel, to grow orderly arrays of precisely positioned carbon nanotubes, for example. The process may also allow for alternating between different gasses, ions, and/or precursors to form multilayer structures.

As such, various embodiments of the present invention comprise a lithographic exposure device for fabricating a microporous filter membrane comprising means for exposing a membrane substrate to a beam comprising at least one energetic particle; means for conveying said membrane substrate; and, a mask positioned between said membrane substrate and at least one source of said at least one energetic particle, said beam comprising at least one ion transmitted through said mask. Further embodiments comprise a filter membrane comprising at least one pore with at least one about one micrometer pore. In various embodiments, the mask is substantially stationary. In various embodiments, a clamp is used to secure said membrane substrate.

Any source of radiation can be used in various embodiments of the present invention. In an embodiment, a helium ion source is used for irradiation. In an embodiment, a hydrogen ion source is used for irradiation. In an embodiment, a neutral particle source is used for irradiation. In an embodiment, a source of neutrals and/or ions of an element selected from the group consisting of He, H, Ne, Xe, C, and B is used for irradiation However, in general, any radiation source can be used.

A suitable energy level is an energy level sufficient to completely penetrate the membrane substrate. The energy may be adjusted to tailor the specific shape of the micropores in the membrane. In various embodiments, the energy is greater than 4 MeV. In various embodiments, the energy is greater than 1 MeV. In various embodiments, the energy is greater than 500 keV. In various alternate embodiments, the energy is greater than 300 keV. In various alternate embodiments, the energy is greater than 100 keV. In various alternate embodiments, the energy is greater than 50 keV. In various alternate embodiments, the energy is greater than 25 keV. In various alternate embodiments, the energy is greater than 10 keV. In general, any energy level can be used as is appropriate for the particular application.

In various embodiments, the energy is sufficient such that the stopping power of an exposing particle in the membrane substrate is at least a threshold at the back of the membrane and/or throughout the thickness of the membrane. It will be understood that stopping power refers to the rate of energy loss. In various embodiments, the threshold is 70 eV/Angstrom (700 eV/nm). In various embodiments, the threshold is 40 eV/Angstrom (400 eV/nm). It will be understood that nm in the threshold refers to distance along a track.

In various embodiments, the energy level is an energy minimized so as to minimize damage to the mask. Low energies assist use of thin masks. In various embodiments, the energy is at most 1 MeV/nucleon of the ions. In various embodiments, the energy is at most 0.5 MeV/nucleon. In various embodiments, the energy is at most than 0.2 MeV/nucleon of the ions. In combination with an energy sufficient to completely penetrate the membrane substrate substrate and to provide a stopping power greater than threshold, the energy is optimized.

In various embodiments, a lithographic exposure device of an embodiment of the present invention comprises a system for conveying the membrane substrate in a stepwise fashion wherein said membrane substrate is advanced about a length of said mask for every step.

After exposure, an etchant system, such as hot KOH solution or an organic solvent, is used to remove the damaged membrane substrate.

Further embodiments comprise a process for fabricating a membrane filter, said process comprising the steps of conveying a membrane substrate in a stepwise fashion adjacent a mask; damaging said membrane substrate with at least one beam comprising at least one ion emitted from at least one radiation source focused at least partially through said mask; and, removing said damaged membrane substrate with an etchant. Thus, for example, in various embodiments, masked ion track lithography is used to pattern a membrane substrate.

Further embodiments comprise application of a high emissivity coating to said filter membrane substrate prior to exposure. As such, various further embodiments comprise removal of the high emissivity coating from said filter membrane substrate after exposure. An example of a water soluble high emissivity coating is black tempera paint. Most other paints, particularly those incorporating titanium dioxide particles also have high emissivity and can be removed in suitable solvents. Silicones also have high emissivities. The choice of a removable high emissivity coatings depends upon the ability of the membrane to withstand the solvent used to remove the coating. For example, Teflon membranes can tolerate acetone and commercial paint stripping solvents whereas polyester membranes cannot.

Further embodiments comprise a filter membrane produced according to the various methods and apparatuses herein disclosed.

In various embodiments, more than one etching step is performed, such that the film is etched by more than one etchant. A surfactant is capable of being added to the pre-etchant or etchant to improve their wetting characteristics and to lower the cone angle, as is understood by one of ordinary skill in the art.

Filters produced with various processes of the present invention are suitable for use in any process or apparatus wherein a separation at least partially based upon size is desired. As such, various embodiments find wide applicability for use in separating materials of a very small size, such as, for example and not by way of limitation, virus, cysts, bacteria and the like. Further industrial embodiments of various membranes produced with processes of the present invention comprise purification of drinking and waste water, pharmaceuticals, food, fuels, chemicals, gas separation ultra filtration filter(s), and/or the like.

Various embodiments of the present invention comprise a process for fabricating a membrane filter, said process comprising the steps of conveying a membrane substrate in a stepwise fashion adjacent a mask; damaging said membrane substrate with at least one beam comprising at least one energetic particle emitted from at least one radiation source directed at least partially through said mask; and, removing said damaged membrane substrate with an etchant.

Still further embodiments comprise a process for fabricating a microporous membrane filter, said process comprising the steps of applying an intermediate mask layer and a resist coating to a membrane substrate; conveying said membrane substrate in a stepwise fashion adjacent a mask; exposing said resist coating with at least one beam comprising at least one energetic particle emitted from at least one radiation source directed at least partially through said mask; developing said resist coating; etching said resists' pattern through said intermediate mask layer; and, etching said intermediate mask layer's pattern into said membrane substrate.

The invention may be embodied in other specific forms without departing from its spirit or essential characteristics. The described embodiments are to be considered in all respects only as illustrative and not restrictive. For example, ceramic materials are expected to function as membrane substrates. However, as the invention contemplates a reel to reel fabrication process, these embodiments were not mentioned, but would be acceptable. The scope of the invention is, therefore, indicated by the appended claims rather than by the foregoing description. All changes to the claims which come within the meaning and range of equivalency of the claims are to be embraced within their scope. Further, all published documents, patents, and applications mentioned herein are hereby incorporated by reference, as if presented in their entirety.

EXAMPLES

FIG. 1 is an illustration of beam (3) of energetic particles impinges on a substantially planar mask (2) perforated by stencil openings (4). A structured beam of transmitted beamlets (5) damages the non-planar membrane substrate (1) in a highly uniform array of regularly spaced regions.

Figure 2:
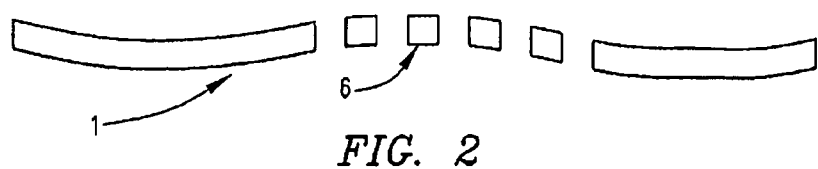
FIG. 2 is an illustration of a membrane substrate subjected to a beam of energetic particles according to the embodiment of FIG. 1 after development in a suitable solvent.

FIG. 1 illustrates the exposure process in which a substantially parallel beam (3) of energetic particles (ions, electrons, or neutral energetic atoms or molecules) impinges on a substantially planar mask (2) perforated by stencil openings (4). Transmitted beamlets (5) form a structured beam that damages the non-planar membrane substrate (1) in a highly uniform array of regularly spaced regions. FIG. 2 shows that after development in a suitable solvent, the non-planar membrane substrate (1) becomes permeated by a highly uniform array of regularly spaced pores (6). The substrate may deform from its original shape during development.

FIG. 2 is an illustration of a membrane substrate after development in a suitable solvent, the non-planar membrane substrate (1) is permeated by a highly uniform array of regularly spaced pores (6).

Figure 7:
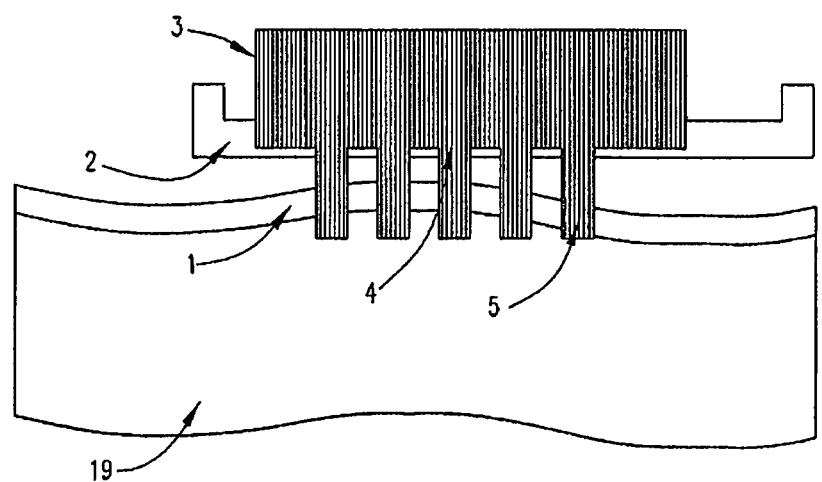
FIG. 7 is an illustration of an embodiment of the present invention where a high emissivity coating is applied to the membrane to enhance radiative cooling during energetic particle exposure.

Generally, exposure of a membrane to energetic particles heats the membrane in proportion to the energy and flux density of the beam. Using a commercially available $H^+$ ion source operating at 500 keV, for example, it is possible, in a preferred embodiment, to achieve power densities of 0.15 $W/cm^2$ on a 3 µm thick polymeric membrane. Since energetic particle beams operate in a high vacuum of 10-5 Torr or less, the only way to remove this heat is through radiation. For an emissivity of unity, the peak temperature rise of the membrane would be less than 40° C., a temperature that all polymers could endure. However, for an emissivity of 0.1, the temperature would rise to 300° C., which would severely damage the more temperature sensitive polymers such as polyester. It may be advantageous, therefore, to apply a high thermal emissivity coating to one side of the membrane substrate prior to exposure to the energetic particle beam. The coating should be applied to the side that is opposite to the side irradiated by energetic particles. In an embodiment, the emissivity of such a coating is about greater than 0.9. In an alternate embodiment, the emissivity of such a coating is about greater than 0.8. In an alternate embodiment, the emissivity of such a coating is about greater than 0.5. However, one of ordinary skill in the art would be able to select an emissivity appropriate for the particular application. The high emissivity coating should be easily removed after the exposure, preferably during the removal of the damaged regions of the membrane substrate. There are many examples of high emissivity coatings including paints containing particles $TiO_2$. Water soluble paints, such as black tempura, can be removed during development. Spray coating provides a practical and inexpensive way of coating just one side of the membrane substrate. FIG. 7 is an illustration of the an embodiment of the present invention where a high emissivity coating (19) is applied to the membrane to enhance radiative cooling during energetic particle exposure. The emissivity of the coating is dependent upon its thickness. In a preferred embodiment, the thickness is between 10 and 125 μm.

For patterning a non-planar substrate, the dimensions of the transmitted beamlets should be essentially unchanged over the height of the topography. In the processing of polymeric sheet stock as described below, flatness is not expected to be better than 1 mm. Moreover, under high tension, most substrates form tension wrinkles, which are corrugations in the machine direction that disappear immediately after relieving tension. Substrates with buckles will usually form much larger tension wrinkles than flat substrates. As the film passes under the mask, the peaks of the tension wrinkles could scrape the mask causing it to break. Various embodiments therefore anticipate patterning over a distance of 5-10 mm from the mask. As such, various embodiments are capable of forming an image over such a large depth-of-field (DoF), defined as the maximum distance over which a particular feature size can be formed, is an important consideration.

Figure 3:
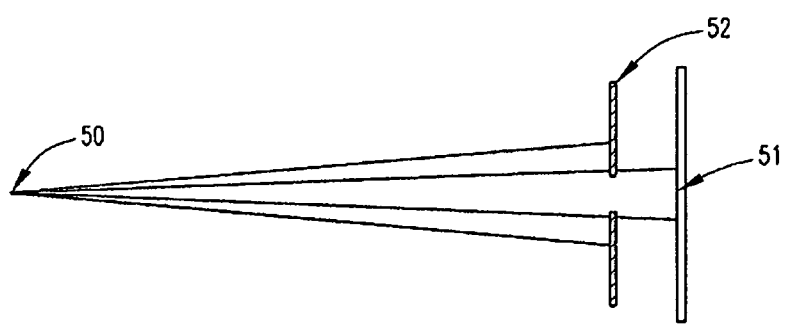
FIG. 3 is an illustration of a shadow generated with a point source of particles.
Figure 4:
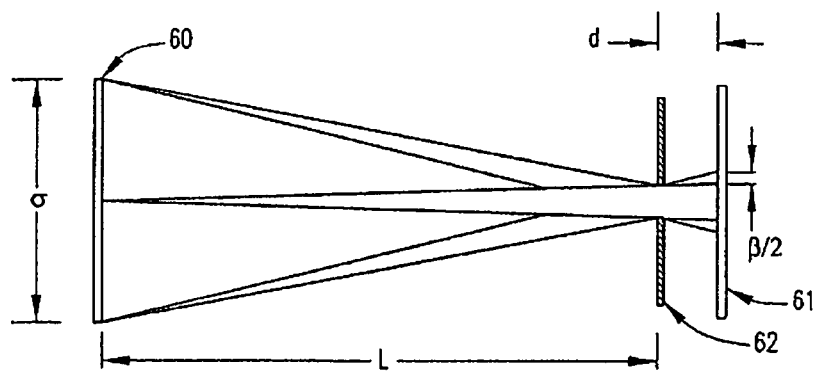
FIG. 4 is an illustration a shadow generated with particles emanating from different points on a source.

In various embodiments of a projection system, a system comprising energetic particle proximity lithography where DoF is limited primarily by the finite size of the energetic particle source, is capable of being used. FIG. 3 shows that the edges of an image of a mask 52 on a substrate 51 are sharp and well-defined for a point-source 57 of particles. FIG. 4 shows that, for an extended source 60, the edges of the shadow of a mask 62 on a substrate 61 are blurred by the overlapping images created by ions emanating from different points on the source. The width β of this penumbral blur is approximately equal to the resolution limit in the printed image. Clearly, $\beta = d\sigma/L$ where σ is the diameter of the source, d is the distance from the mask to the substrate, and L is the distance from the source to the mask. In the duoplasmatron ion source, for example, DoF can be more than 10,000 times larger than the minimum resolvable feature; thus, 1 micrometer size features can be printed on a surface located 10 mm from the mask. This implies that a freestanding membrane need only be held flat within a 5-10 mm tolerance for creating 1 micrometer pore openings. This is more than 100,000 times less constraining than the 100 nm flatness tolerances discussed by Van Rijn.

In various embodiments, a film processed under an embodiment of the present invention is held stationary while energetic particle exposure to beam 103 is taking place. This could be done with an electrostatic clamp as shown in FIG. 5 where a substrate platen 109 is divided by an electrically insulating spacer 115 into two regions 110 and 111. The polymeric membrane material 112 may be coated with a thin metal film 113 to make the top surface electrically conducting and different voltages applied to regions 110 and 111. Electrostatic forces between the platen and the metal film then clamp the polymer to the platen. The flatness of the platen need only conform to the DoF specifications. Moreover, the clamping need not produce a perfectly flat polymeric film. Voids and wrinkles may be tolerated as long as they conformed to the DoF specifications.

Figure 6:
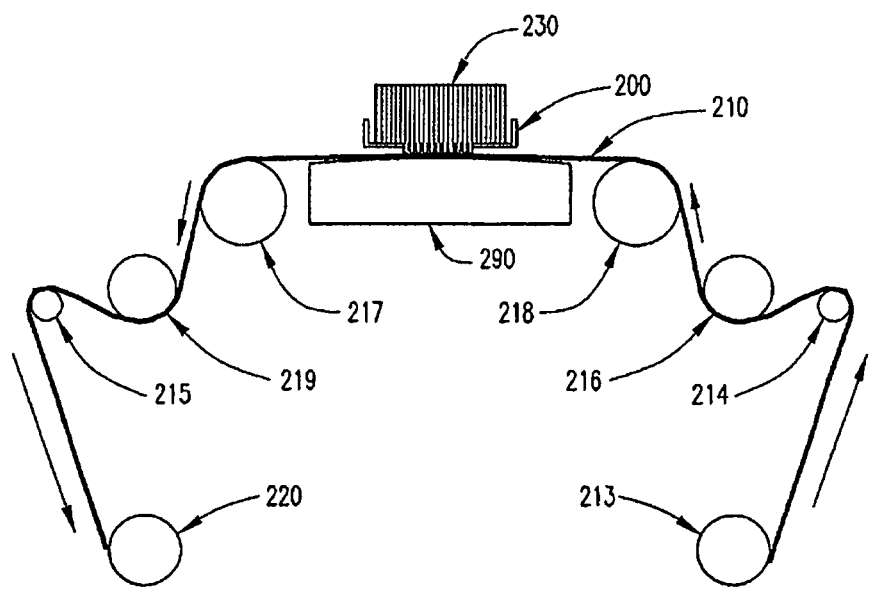
FIG. 6 is an illustration of an embodiment of a reel-to-reel apparatus for manufacturing microporous filters.

Now referring to FIG. 6, a reel-to-reel manufacturing apparatus is disclosed for manufacturing microporous filters in a continuous manner. Polymeric feed stock 210 is fed from a supply reel 213 through a series of in-feed rollers tensioner 214, capstan drive 216, and idler 218 onto the substrate platen 290 where it is exposed to an ion beam 230 through a stencil mask 200. After exposure, the membrane passes through tensioner 217, capstan drive 219, and idler 215 and wound on take-up reel 220.

Figure 8:
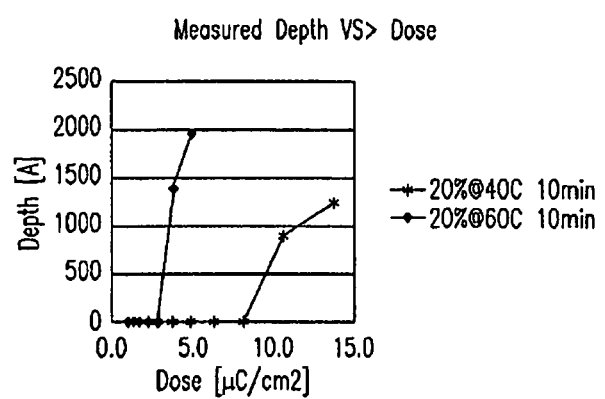
FIG. 8 is an illustration of an etch depth in a Mylar membrane filter, developed in a hot 20% $KOH/H_2O$ solution, as a function of 50 keV He+ ion dose.
Figure 9:
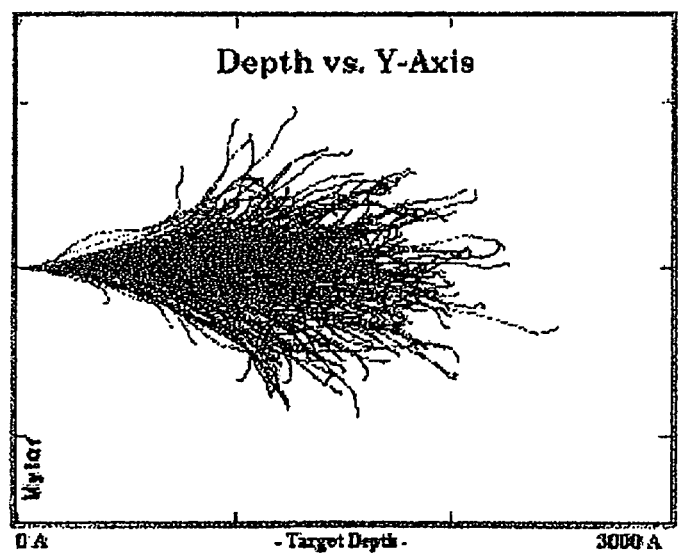
FIG. 9 is an illustration of simulated $He^+$ ion trajectories in a Mylar membrane filter for an initial energy of 50 keV.
Figure 10C:
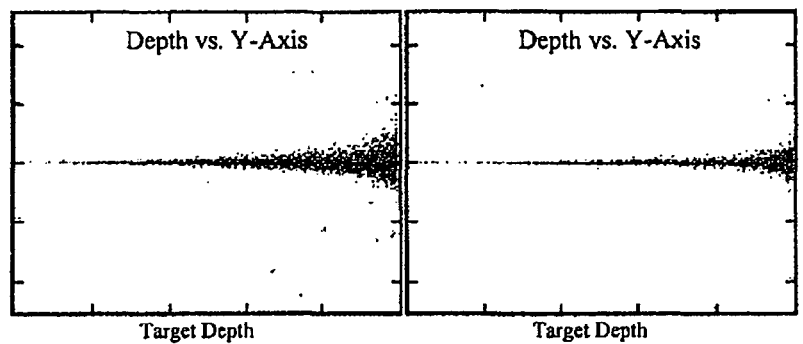
FIG. 10 is an illustration of simulated $He^+$ ion trajectories in a Mylar membrane filter for initial energies of a) 400 keV, b) 600 keV, and c) 900 keV.
Figure 10C:
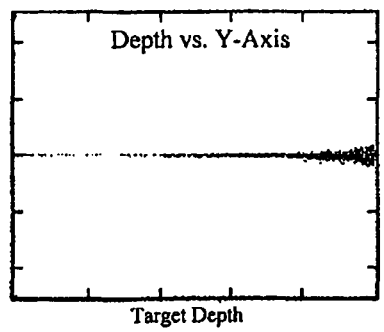

In an embodiment, experiments have demonstrated the patterning of a polyethylene teraphthalate (Mylar) film by 50 keV He+ ion beam irradiation using a 20% KOH/H$_2$O developer. FIG. 8 shows the development depth as a function of ion dose for 40° C. and 60° C. development temperatures. The dose required to remove 1500 angstroms is about 6 μC/cm$^2$. The etch depth typically is smaller than that required for fabricating membrane filters. This is because these low energy ions stop about 200 nm into the film, FIG. 9. The spreading of the ions near the end of their trajectories is also a concern because it is capable of degrading the resolution of the printed mask image. Hydrogen ions (protons) are capable of use in this regard. FIG. 10 shows that 400 keV, 600 keV, and 900 keV protons have sufficient range to penetrate mylar films of varying thickness, such as, but not limited to, 3, 4, and/or 5 micrometers with a blur of less than 0.1 micrometers.

Figure 11A:
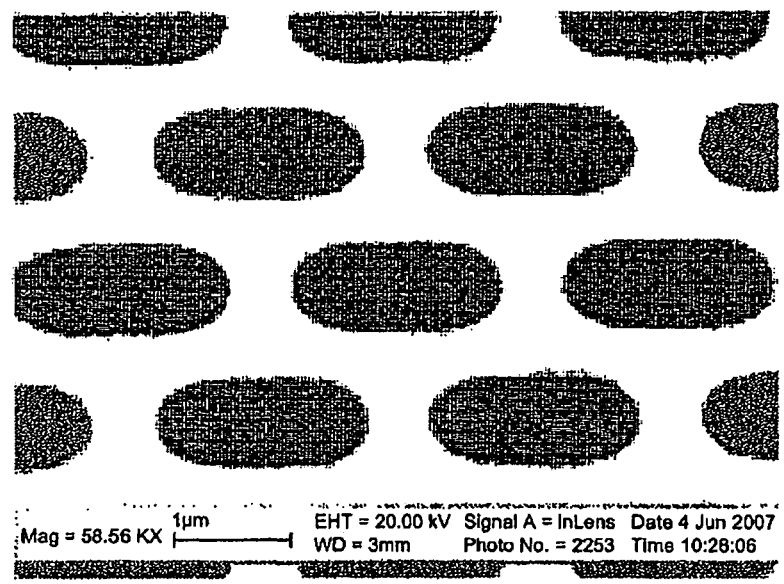
FIG. 11 is a scanning electron micrograph of a) stencil mask for fabricating a particulate filters with 0.8 μm stencil openings and b) a textured polyester (Mylar) film printed with 50 keV helium ions and developed in a hot 20% $KOH/H_2O$ solution. The film was loosely attached to a platen at the corners with tape during the exposure. The flatness of the film was about 2 mm.
Figure 11B:
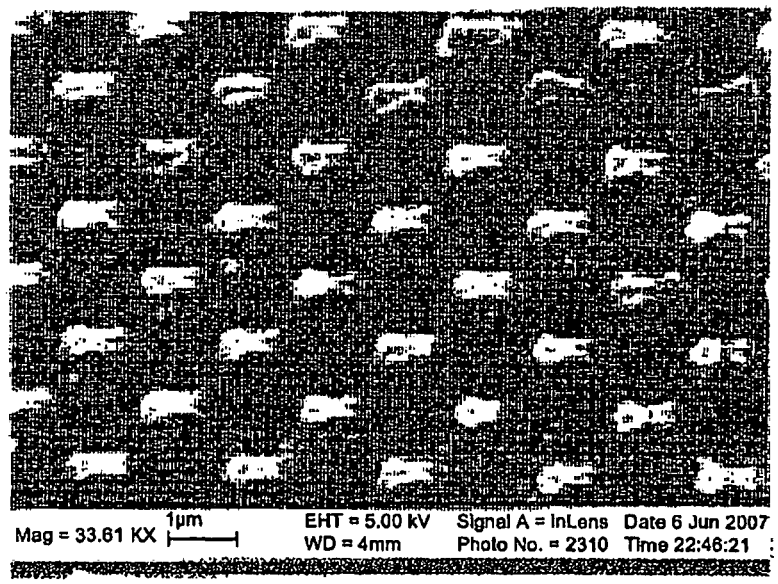

FIG. 11 a) is a silicon nitride stencil mask with 0.8×1.6 μm$^2$ openings. FIG. 11 b) is the 50 keV He+ image of the stencil mask in a) printed in a sample of Mylar sheet stock. The Mylar 1×1 in$^2$ sheet was loosely attached to a holder with tape at the corners. The flatness of the wrinkled sample was estimated at 2 mm. The film was developed in hot KOH (40° C.). Although the energy of the helium ions was insufficient to completely penetrate the mylar film, this micrograph clearly demonstrates direct patterning of mylar with helium ions over a large depth of field.

In the present membrane transport systems, it is desirable that the relative position of the mask and membrane remain fixed during exposure. The present inventors contemplate running the tape continuously at a constant and extremely well-regulated speed. The present inventors expect the mask would then track the membrane during exposure and snap back to its original position as a new exposure begins.

To minimize heating of the membrane substrate during patterning, it is desirable that the rate of energy loss in the mask and substrate be minimized, subject to the constraint of track etchability.

Figure 12:
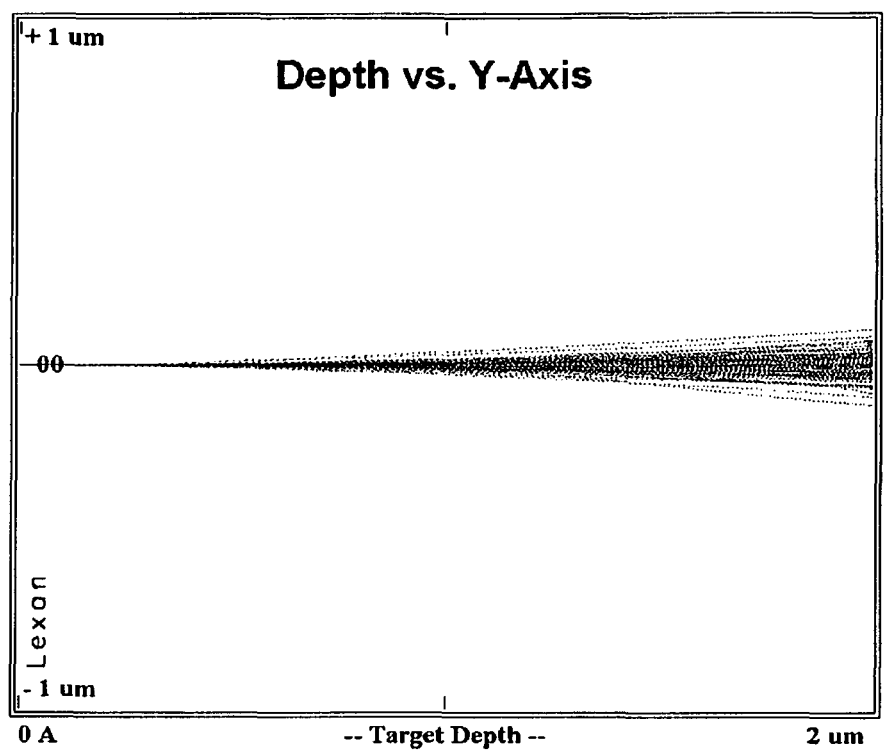
FIG. 12 is an illustration of simulated trajectories of 4 MeV $Ne^+$ ions in a 2 μm thick polycarbonate film.
Figure 13:
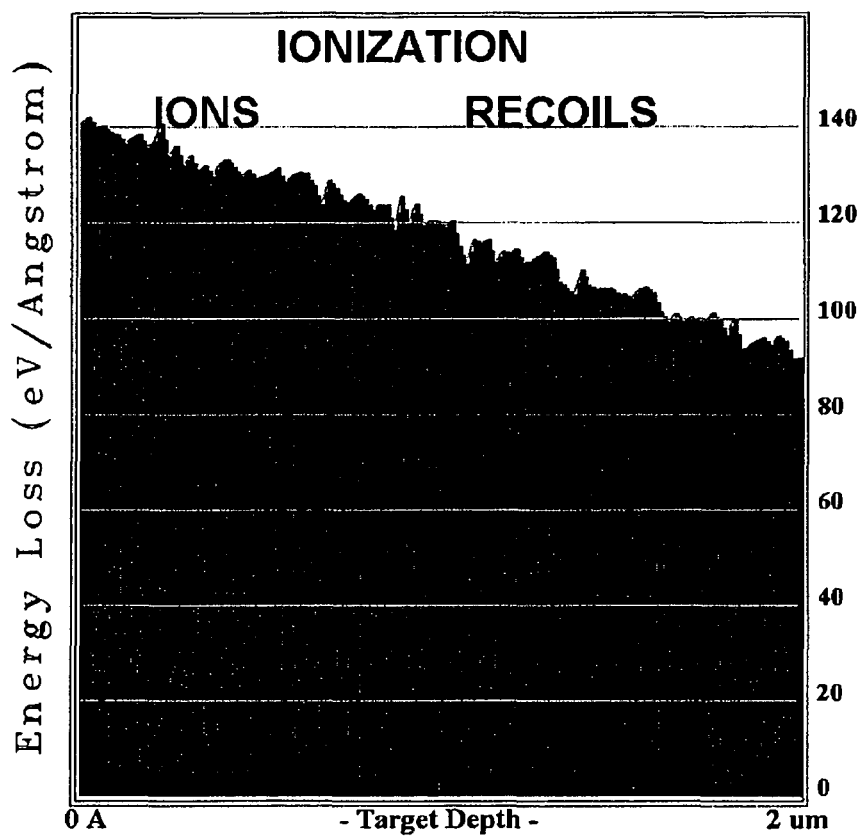
FIG. 13 is an illustration of simulated rate of energy loss in a 2 μm thick polycarbonate film.
Figure 14:
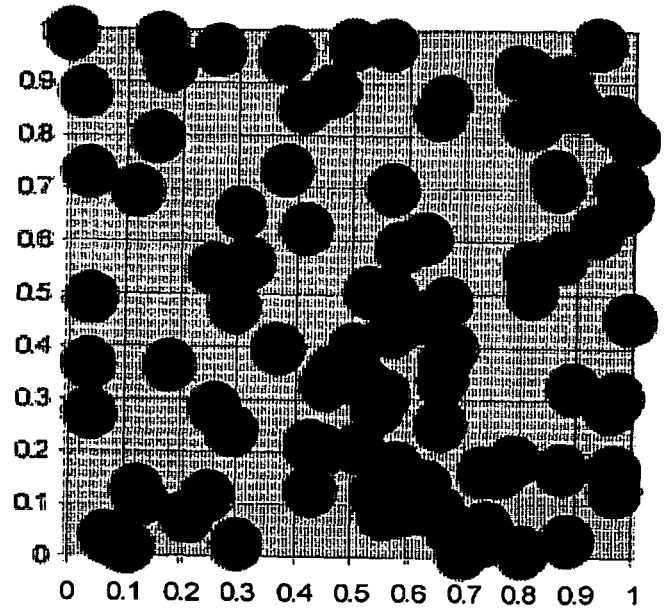
FIG. 14 is an illustration of a simulated hole pattern produced by 100 ion tracks within a unit square.

In an embodiment, investigations have demonstrated the patterning of a 2 μm thick polycarbonate membrane by 4 MeV Ne+. For this particular embodiment, Figure shows simulated trajectories, and FIG. 13 shows the simulated rate of energy loss (stopping power). More particularly, FIG. 12 shows that the width of the distribution on the back side of the membrane is 80 nm (2σ). Based on different experiments under different conditions, using neon and argon ions with 18-60 keV amu, Musket proposed a stopping power threshold for Argon and Ne in polycarbonate in an unmasked system of <6 MeV cm$^2$/mg (Musket, R. G., "Extending Ion Track Lithography to the Low-Energy Ion Regime", J. Applied Physics 99, 114314-23, (2006), published online 12 Jun. 2006), stating "additional experiments with lower energy Ar and/or Ne ions are needed to actually determine the threshold for creation of etchable tracks" (p. 114322). The present inventors have estimated a conservative threshold for stopping power for etchable track formation of 70 eV/Angstrom, which is not limited to polycarbononate. The present inventors believe that polycarbonate is among the least sensitive of common polymeric materials to ion damage. Thus, the threshold estimated from polycarbonate measurements is a conservative estimate for many polymeric materials.

FIG. 13 shows that the rate of energy loss is greater than 70 eV/Angstrom along the entire track. There is 40 nm (1σ) of lateral scattering as the ions traverse the membrane. Thus, 4 MeV Ne+ is near optimal for patterning polycarbonate of this thickness. Neon has a mass of 22. Thus, these simulations illustrates an energy of 0.2 MeV/nucleon.

It will be understood that the present inventors contemplate a threshold of 40 eV/Angstrom. This would correspond to 3 MeV cm$^2$/mg in polycarbonate, using the density of polycarbonate. Further, the present inventors contemplate boron ions or neutrals as energetic particles. Achieving 40 eV/Angstrom is possible for boron. The present inventors anticipate that simulations for boron similar to those for Ne that generated FIG. 13 will demonstrate that a rate of energy loss greater than 40 eV/Angstrom along the entire track is possible. Rare gases have the advantage that they are easier to handle. In contrast, a common source gas for boron ion, boron trifuloride is toxic. However, boron ion has the advantage that it is common in the semiconductor industry. Thus conventional apparatuses, such as the Varian VIISta implanter, may be used to address the desirability for a specialized gas handling system and pumps.

There are many commercial implanters that could satisfy the current and voltage requirements of a 4 MeV Ne$^+$ source. A particular implanter, the Varian VIISta implanter, has the advantage that it can scan a 30×30 cm$^2$ area with a uniform beam of essentially perfect collimation and uniform inclination. However, this tool may not be able to produce 4 MeV particles since neon does not form the negative ions required for its 2 MeV tandem accelerator. The present inventors contemplate that doubly charged Ne$^{++}$ could solve this problem.

A feature of ion track formation is that the diameter of the pore increases linearly with time. The present inventors expect it would take about 8 minutes of etching to open 100 nm tracks in polycarbonate under the conditions assumed above. As is shown herein, the ability to expand the track diameter dramatically reduces the exposure dose required to define a filter pore. This leads to very high potential throughput. To see this, consider a mask opening with sides of unit length exposed with N random tracks. We assume that the tracks have been expanded during the etching step to a diameter of 0.1.

Figure 15:
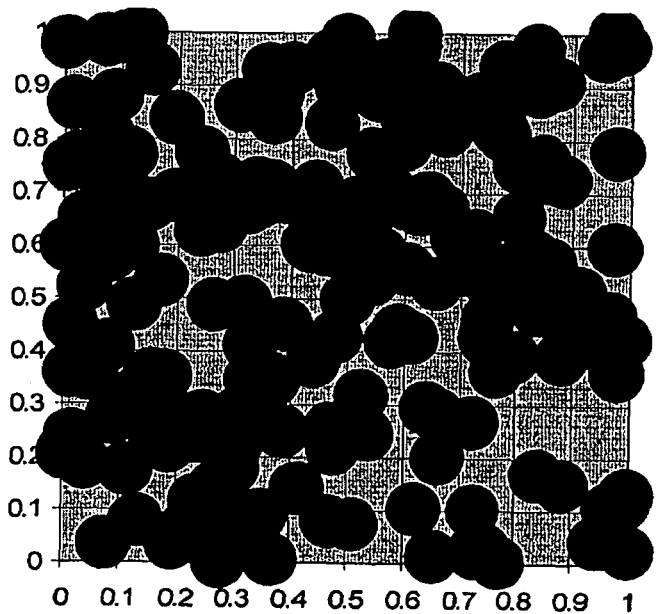
FIG. 15 is an illustration of a simulated hole pattern produced by 200 ion tracks within a unit square.
Figure 16:
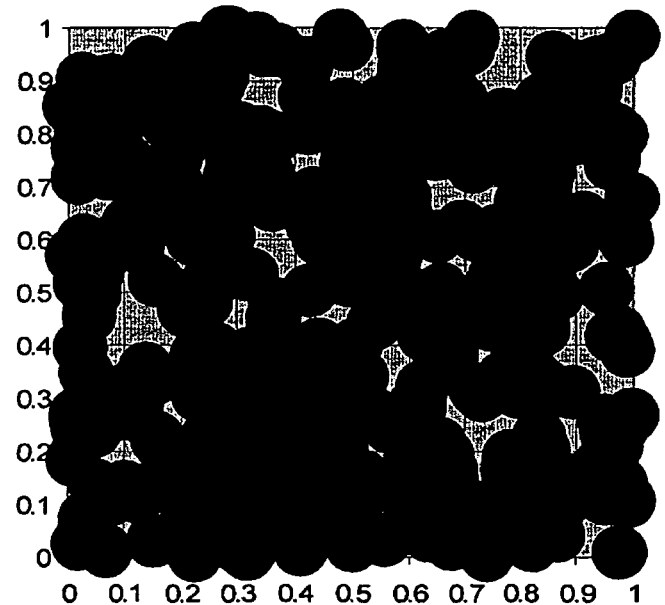
FIG. 16 is an illustration of a simulated hole pattern produced by 400 ion tracks within a unit square.
Figure 17:
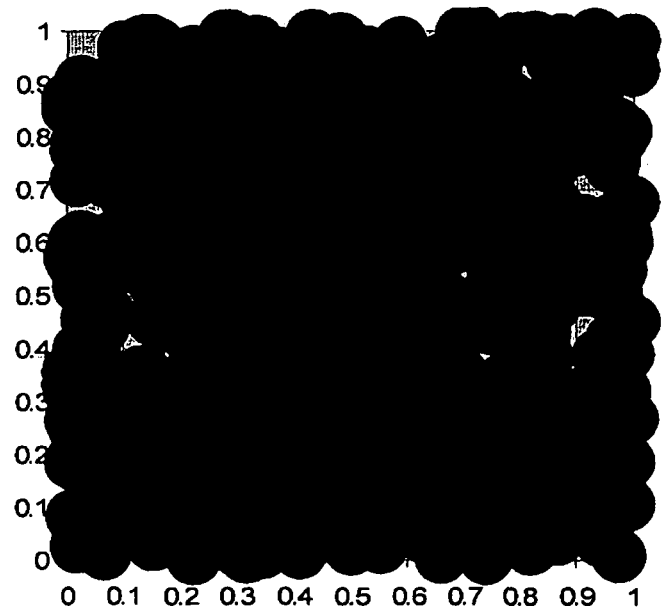
FIG. 17 is an illustration of a simulated hole pattern produced by 800 ion tracks within a unit square.

Figure shows a representative hole pattern defined by 100 tracks. For FIG. 3, each track has been opened up to a diameter of $\frac{1}{10}^{th}$ the width of the square. Clearly, the image is noisy and the pore size not well formed. The noise improves dramatically as more tracks are used to define the pore. FIG. 1 FIG.-17 show pores defined by 200, 400, and 800 tracks, respectively. For FIGS. 15-17, each track has been opened up to a diameter of $\frac{1}{10}^{th}$ the width of the square. The present inventors expect that 400 particles will be adequate for most filter applications. A dose of 400 particles is exemplary of a dose optimized to minimize particle density while still leading to hole formation upon etching. It will be understood that the optimized dose depends on the edge roughness suitable for a particular application. The present inventors contemplate minimizing the dose subject to a roughness constraint. A less rough edge results from a higher dose for a selected etch time. It will be understood that a longer etch time permits a lower dose.

According to some embodiments, throughput is maintained below limits influenced by thermal effects. In addition, it is envisioned that track annealing limits the peak temperature of polymeric membranes to the glass transition temperature. For polycarbonate, this is about 145° C. (418 K). For Mylar, it is only about 70° C. As an example, assume that we will pattern an aluminized polycarbonate film (Winter-Wolff International, Inc) with a thickness of 2.0 µm. The purpose of the aluminum coating is to prevent charging during exposure and is removed automatically during the track etching step. Except for the shortest exposure times, the maximum temperature will be the steady state, radiation-limited value. We use the published emissivity (0.24) for 2 µm thick aluminized Kapton since the value for polycarbonate is not available. The radiated power density from the uncoated side of the polycarbonate for a steady state temperature of 418 K is 42 mW/cm$^2$. Since the energy deposited in the polycarbonate film by each neon ion is 2.5 MeV, the maximum permissible average current density on the membrane is 0.017 µA/cm$^2$. If the pore density is 25%, the current density in the exposed pores can be 4 times higher, or 0.068 µA/cm.$^2$. Assuming 400 particles per pore gives the exposure dose and the corresponding exposure time as a function of pore size, the results outlined in Table 1 may be obtained. The thermal throughput limit can then be calculated assuming a 30×30 cm$^2$ exposure area and a production schedule of 4400 hours/year (2 shifts/day). The Varian VIISta 3000 Single Wafer High-Energy Ion Implanter can produce about 40 times the required current density over this area. It is desirable to manage the exposure process, which requires a stable mask that can tolerate an enormous dose of implanted ions and absolute registration between the mask and the developing latent image in the polycarbonate film. At the highest throughput, it is desirable to accommodate a vast area of exposed film in the etching tank.

TABLE 1

Critical dose and thermal throughput limit as a function of pore diameter for conditions discussed in the text.
Masked ion track lithography for 2 µm thick polycarbonate:
4 MeV Ne$^+$, 0.068 µA/cm$^2$, 30 × 30 cm$^2$ mask area, 400 particles/pore, track diameter = pore size/10, 4400 hours/year

| Pore size (µm) | Track diameter (µm) | Critical dose (µC/cm$^2$) | Exposure time (s) | Throughput (m$^2$/s) | Throughput limit (ft$^2$/year) |
|---|---|---|---|---|---|
| 0.10 | 0.01 | 0.640 | 9.55 | 0.009 | 1.6E+06 |
| 0.15 | 0.02 | 0.284 | 4.25 | 0.021 | 3.6E+06 |
| 0.50 | 0.05 | 0.026 | 0.38 | 0.236 | 4.0E+07 |
| 1.00 | 0.10 | 0.006 | 0.10 | 0.942 | 1.6E+08 |
| 1.50 | 0.15 | 0.003 | 0.04 | 2.120 | 3.6E+08 |

A process flow for mask fabrication is shown in

Figure 18A:
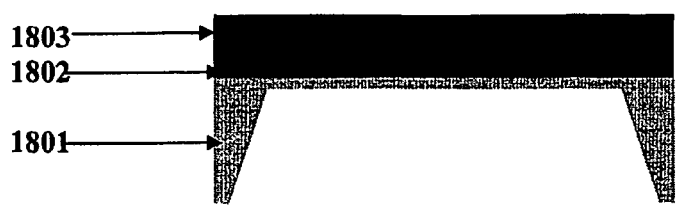
FIGS. 18a-d illustrate a process flow for silicon stencil mask fabrication.
Figure 18B:
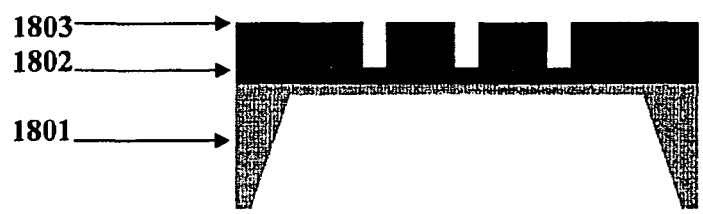
Figure 18C:
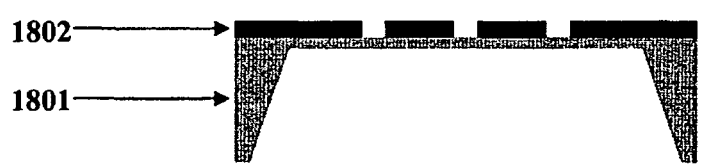
Figure 18D:
Figure 19:
FIG. 19 is a scanning electron micrograph of an array of 80 nm holes etched 500 deep in a silicon wafer by HBr RIE.
Figure 20:
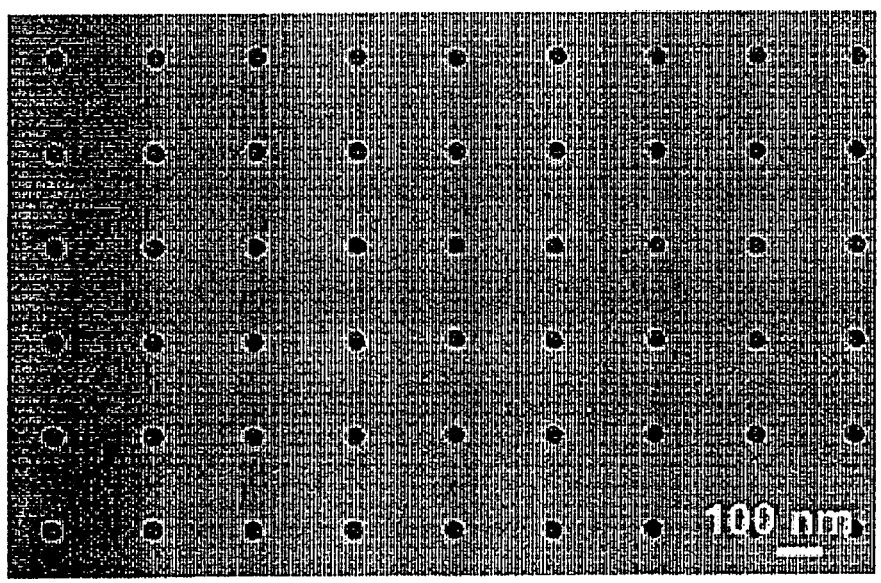
FIG. 20 is a scanning electron micrograph of the back side of a 0.7 μm thick silicon membrane with an array of 75 nm open windows.

A hard mask material 1802, typically silicon dioxide, is deposited on the silicon membrane 1801. The hard mask is coated with a film of resist 1803, forming a first structure as illustrated in FIG. 18a. Electron beam lithography is used to define the pattern in the resist 1803, forming a second structure as illustrated in FIG. 18b. The resist pattern is transferred into the hard mask layer by an etching technique that is decided based on the material of the hard mask, forming a third structure as illustrated in FIG. 18c. Reactive ion etching using a halogen based etching chemistry is used to transfer the hard mask pattern into the silicon membrane, forming a structure as shown in FIG. 18d.

In various embodiments using the above described process, exemplary masks were fabricated on blank silicon membranes, available from Nanostructures, Inc. (Santa Clara) and Institut für Mikroelektronik Stuttgart, Germany. The membrane was coated with an SiO$_2$ hardmask and Poly(methylmethacrylate) (PMMA) resist. The resist was patterned by electron beam lithography, available at Cornell, Stanford, or Argonne National Laboratory and the PMMA pattern transferred into the hardmask by reactive ion etching (RIE) in a C$_4$F$_8$ plasma and through the membrane by HBr-RIE. Mask etching was carried out at the University of Houston using a dedicated etching tool. Masks are loaded into the upper chamber where C$_4$F$_8$-RIE transfers the PMMA pattern into the hard-mask. The mask was then transferred, in vacuum, to the lower chamber where the membrane is etched by HBr-RIE. Helpful to high quality etching was good vacuum and the system having two very large, 2200 lps and 1600 lps, turbomolecular pumps backed by a Roots blower and dry mechanical pump.

Figure shows the fractured surface of solid silicon substrate into which 80 nm holes have been etched to a depth of 500 nm. Error! Reference source not found. shows the back of a 0.7 µm thick membrane with an array of 75 nm etched openings.

Figure 21:
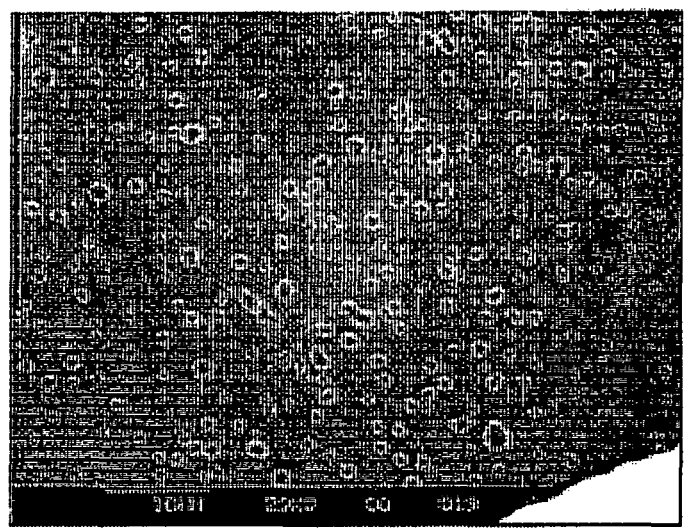
FIG. 21 is a scanning electron micrograph of a silicon mask blistered due to helium ion implantation during lithography.
Figure 22:
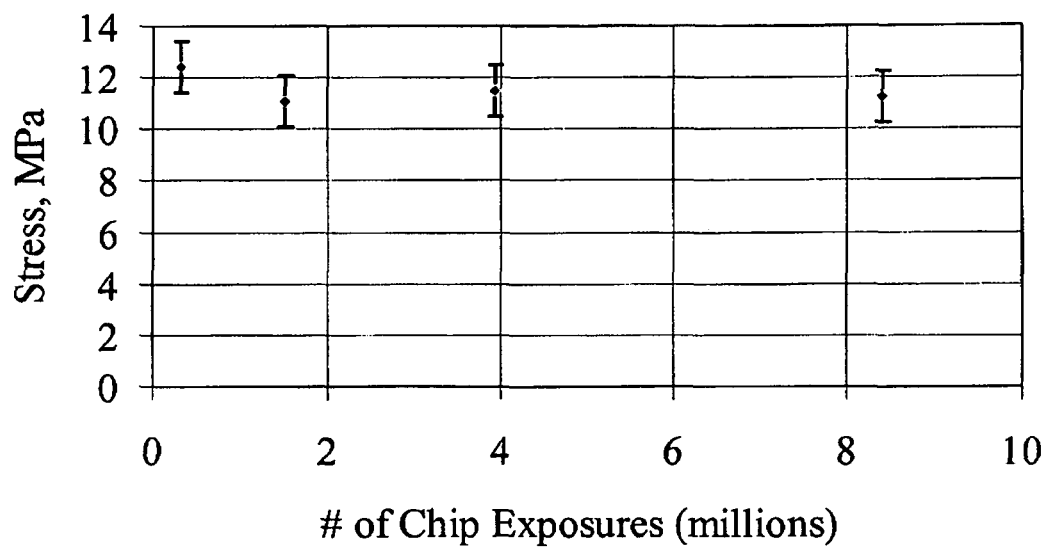
FIG. 22 is a plot of measured stress as a function of 20 keV $He^+$ ion dose for a membrane with a glassy carbon ion absorbing layer.
Figure 23:
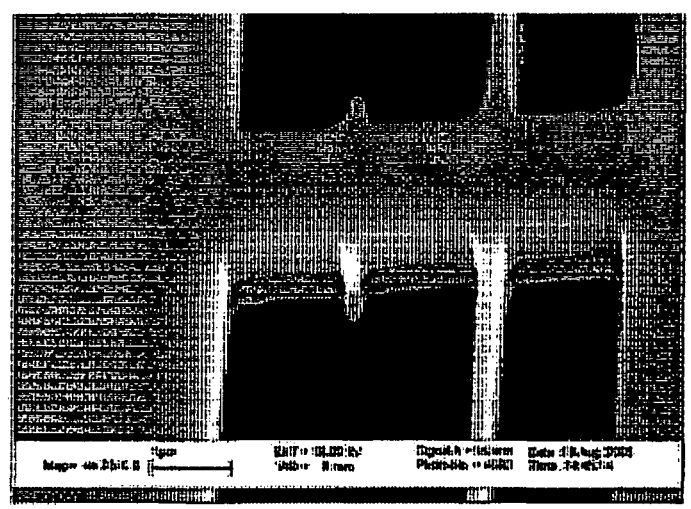
FIG. 23 is a scanning electron micrograph of a 370 nm thick protective coating on top of a 400 nm thick silicon stencil mask.

It is desirable to reduce damage to the mask by implanted atoms, which, as illustrated in FIG. 21, can cause blistering and loss of tension in bare silicon membranes. As shown in FIG. 22, the present inventors have developed a vitreous carbon mask coating that can protect against $He^+$ ion implantation for doses corresponding to at least 10 Million PMMA exposures. The coating is applied to a patterned silicon mask and $O_2$-RIE transfers the original mask pattern into the film. assy carbon ion absorbing layer;

FIG. 23 shows a patterned silicon mask with a protective carbon coating. The present inventors note the replication of nanoscale roughness from the silicon mask into the film, and the absence of undercutting.

Figure 24:
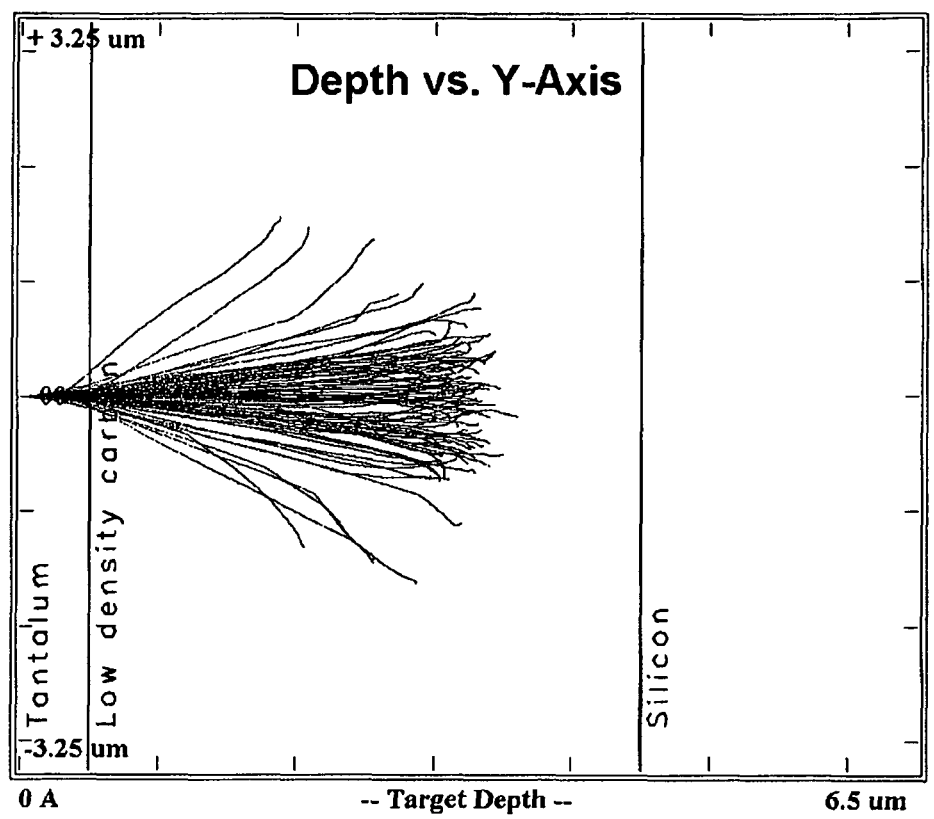
FIG. 24 is an illustration of simulated 4 MeV $Ne^+$ trajectories in a silicon mask with a low density carbon layer and a tantalum stopping layer.

Polymers tend to decompose under 4 MeV neon ion bombardment leaving a low density matrix of amorphous carbon. This matrix, which forms doses in the 1-10 µC/cm 2 range, becomes vitreous at higher doses in a manner similar to the Wasson coating, which endures unchanged for extremely high doses. Thus, the present inventors contemplate that it is possible to create a stable mask coating simply by irradiating a polymer that has been applied to the mask. The present inventors contemplate a diamond-like carbon coating for this purpose. The design incorporates a tantalum layer to slow down the ions before it enters the low density carbon layer where ions stop and diffuse through the porous matrix to nearby mask openings. The tantalum film may be applied to a patterned mask and C4F8-RIE used to transfer the mask pattern into the tantalum. Figure 24 illustrates 4 MeV Ne+ trajectories in a silicon mask with a low density carbon layer and a tantalum stopping layer.

The invention claimed is:

1. A lithographic exposure device for fabricating a microporous filter membrane, said microporous filter membrane not supported by a solid substrate, comprising:
    exposing a membrane substrate to a beam comprising a substantially parallel beam of energetic particles, wherein the membrane substrate has a thickness of 100 nm to 4 µm, the energetic particles have an energy sufficient to completely penetrate the membrane substrate but less than the Bragg energy of the energetic particles to form pores in the membrane substrate, said beam comprises energetic particles with optimized energy, wherein the optimized energy is at least sufficient to completely penetrate the membrane substrate with a rate of energy loss greater than 400 eV/nm; wherein the optimized energy is at most 1 MeV/nucleon, a pore density is larger than 1 million per square cm;
    applying a high emissivity coating to said membrane substrate prior to exposing said membrane substrate to said beam, wherein the high emissivity coating has an emissivity coefficient greater than 0.5;
    conveying said membrane substrate, wherein the membrane substrate is unsupported; and
    a mask positioned between said membrane substrate and substantially parallel beam of energetic particles, wherein the membrane substrate is 5-10 mm from the mask to prevent pore overlap, and said beam comprising at least one particle transmitted through said mask.

2. The lithographic exposure device of claim 1, wherein said mask is substantially stationary.

3. The lithographic exposure device of claim 1, wherein said conveying said membrane substrate further comprises a clamp for securing said membrane substrate.

4. The lithographic exposure device of claim 1, wherein said conveying of said membrane substrate advances said membrane substrate in a stepwise fashion, wherein said membrane substrate is advanced about a length of said mask for every step.

5. The lithographic exposure device of claim 1, further comprising an etchant exposure system.

6. The lithographic exposure device of claim 1, further comprising removing said high emissivity coating from said filter membrane substrate after exposure.

7. A filter membrane produced with a device according to claim 1.

8. A lithographic exposure device according to claim 1, wherein said energetic particles are selected from at least one of an ion, a photon, an electron, a neutral energetic atom and an energetic molecule.

9. A lithographic exposure device for fabricating a microporous filter membrane, said microporous filter membrane not supported by a solid substrate, comprising:
    a radiation source directed at least partially on a membrane substrate, wherein the membrane substrate has a thickness of 100 nm to 4 µm, said radiation source's radiation emitted comprises a substantially parallel beam of energetic particles, wherein the energetic particles have an energy sufficient to completely penetrate the membrane substrate but less than the Bragg energy of the energetic particles to form pores in the membrane substrate, said beam comprises energetic particles with optimized energy, wherein the optimized energy is at least sufficient to completely penetrate the membrane substrate with a rate of energy loss greater than 400 eV/nm; and wherein the optimized energy is at most 1 MeV/nucleon, and a pore density is larger than 1 million per square cm;
    a device for conveying said membrane substrate comprising at least one supply reel and at least one take-up reel, wherein the membrane substrate is 5-10 mm from a mask to prevent pore overlap and wherein the membrane substrate is unsupported; and
    wherein the mask is positioned between said membrane substrate and the beam of energetic particles, said beam comprising at least one particle transmitted through said mask.

10. The lithographic exposure device of claim 9, wherein said mask is substantially stationary.

11. The lithographic exposure device of claim 9, wherein said device for conveying said membrane substrate further comprises a clamp for securing said membrane substrate.

12. The lithographic exposure device of claim 9, further comprising an etchant exposure system.

13. The lithographic exposure device of claim 9, further comprising a device for removing a high emissivity coating from said filter membrane substrate after exposure.

14. A filter membrane produced with the device according to claim 9.

15. The lithographic exposure device of claim 9, wherein said beam comprises energetic particles selected from the groups consisting of H, He, Ne, Xe, C, and B ions and neutral atoms.

16. The lithographic exposure device of claim 11, wherein said clamp is electrostatic.

17. A process for fabricating a microporous filter membrane filter, said microporous filter membrane not supported by a solid substrate, said process comprising the steps of:
    conveying a membrane substrate in a stepwise fashion adjacent a mask, wherein the membrane substrate is unsupported, the membrane substrate has a thickness of 100 nm to 4 µm, the membrane substrate is 5-10 mm from the mask to prevent pore overlap, and a pore density is larger than 1 million per square cm;

applying a high emissivity coating to said membrane substrate, wherein the high emissivity coating has an emissivity coefficient greater than 0.5;

damaging said membrane substrate with a substantially parallel beam comprising energetic particles emitted from at least one radiation source directed at least partially through said mask, wherein the energetic particles have an energy sufficient to completely penetrate the membrane substrate but less than the Bragg energy of the energetic particles to form pores in the membrane substrate, said beam comprises energetic particles with optimized energy, wherein the optimized energy is at least sufficient to completely penetrate the membrane substrate with a rate of energy loss greater than 400 eV/nm; and wherein the optimized energy is at most 1 MeV/nucleon; and removing damaged portions of said membrane substrate with an etchant.

18. The process of claim 17, wherein said step of conveying said membrane substrate in a stepwise fashion advances said membrane substrate about a length of said mask for every step.

19. The process of claim 17, wherein said membrane substrate is substantially stationary for at least a portion of each step.

20. A filter membrane produced according to the process of claim 17.

21. A process for fabricating a microporous membrane filter, said process comprising the steps of:

applying an intermediate mask layer and a resist coating to a membrane substrate;

applying a high emissivity coating to said membrane substrate, wherein the high emissivity coating has an emissivity coefficient greater than 0.5;

conveying said membrane substrate in a stepwise fashion adjacent a mask, wherein the membrane substrate is unsupported, the membrane substrate has a thickness of 100 nm to 4 μm, the membrane substrate is 5-10 mm from the mask to prevent pore overlap, and a pore density is larger than 1 million per square cm;

exposing said resist coating with a substantially parallel beam comprising energetic particles emitted from at least one radiation source directed at least partially through said mask, wherein the energetic particles have an energy sufficient to completely penetrate the membrane substrate but less than the Bragg energy of the energetic particles to form pores in the membrane substrate, said beam comprises energetic particles with optimized energy, wherein the optimized energy is at least sufficient to completely penetrate the membrane substrate with a rate of energy loss greater than 400 eV/nm; and wherein the optimized energy is at most 1 MeV/nucleon;

developing said resist coating;

etching said resists' pattern through said intermediate mask layer; and etching said intermediate mask layer's pattern into said membrane substrate.

22. The lithographic exposure device of claim 1, wherein said beam comprises energetic particles selected from the groups consisting of H, He, Ne, Xe, C, and B ions and neutral atoms.

23. The lithographic exposure device of claim 9, further comprising a device for applying a high emissivity coating to said membrane substrate prior to exposing said membrane substrate to said radiation source, wherein the high emissivity coating has an emissivity coefficient greater than 0.5.

24. The lithographic exposure device of claim 1, wherein a deviation in pore size is less than 5%.

* * * * *